(12) United States Patent
Mizan et al.

(10) Patent No.: US 10,529,802 B2
(45) Date of Patent: Jan. 7, 2020

(54) SCALABLE CIRCUIT-UNDER-PAD DEVICE TOPOLOGIES FOR LATERAL GAN POWER TRANSISTORS

(71) Applicant: GaN Systems Inc., Ottawa (CA)

(72) Inventors: Ahmad Mizan, Kanata (CA); Hossein Mousavian, Kanata (CA); Xiaodong Cui, Nepean (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 15/988,453

(22) Filed: May 24, 2018

(65) Prior Publication Data

US 2019/0081141 A1  Mar. 14, 2019

Related U.S. Application Data

(63) Continuation-in-part of application No. 15/704,458, filed on Sep. 14, 2017, now Pat. No. 10,218,346.

(51) Int. Cl.
*H01L 29/06* (2006.01)
*H01L 23/482* (2006.01)
(Continued)

(52) U.S. Cl.
CPC ...... *H01L 29/0696* (2013.01); *H01L 23/4824* (2013.01); *H01L 23/528* (2013.01);
(Continued)

(58) Field of Classification Search
CPC ......... H01L 29/66431; H01L 29/66462; H01L 29/778–7787; H01L 2924/13064; H01L 29/201; H01L 29/205; H01L 29/2003; H01L 29/0692; H01L 29/0696; H01L 27/0203; H01L 27/0207; H01L 23/528–5286; H01L 23/4824; H01L 29/41758; H01L 29/42316; H01L 29/4238; H01L 29/402
See application file for complete search history.

(56) References Cited

U.S. PATENT DOCUMENTS 7,550,821 B2 * 6/2009 Shibata .................. H01L 24/05
257/615
8,791,508 B2 7/2014 Roberts et al.
(Continued)

*Primary Examiner* — Younes Boulghassoul
(74) *Attorney, Agent, or Firm* — Miltons IP/p.i.

(57) ABSTRACT

Circuit-Under-Pad (CUP) device topologies for high current lateral GaN power transistors comprise first and second levels of on-chip metallization M1 and M2; M1 defines source, drain and gate finger electrodes of a plurality of sections of a multi-section transistor and a gate bus; M2 defines an overlying contact structure comprising a drain pad and source pads extending over active regions of each section. The drain and source pads of M2 are interconnected by conductive micro-vias to respective underlying drain and source finger electrodes of M1. The pad structure and the micro-via interconnections are configured to reduce current density in self-supported widths of source and drain finger electrodes, i.e. to optimize a maximum current density for each section. For reduced gate loop inductance, part of each source pad is routed over the gate bus. Proposed CUP device structures provide for higher current carrying capability and reduced drain-source resistance.

24 Claims, 8 Drawing Sheets

(51) Int. Cl.
  *H01L 23/528* (2006.01)
  *H01L 23/522* (2006.01)
  *H01L 29/205* (2006.01)
  *H01L 29/20* (2006.01)
  *H01L 29/417* (2006.01)
  *H01L 29/40* (2006.01)

(52) U.S. Cl.
  CPC ........ *H01L 23/5226* (2013.01); *H01L 29/205* (2013.01); *H01L 29/2003* (2013.01); *H01L 29/402* (2013.01); *H01L 29/41758* (2013.01)

(56) References Cited

U.S. PATENT DOCUMENTS

| | | | |
|---|---|---|---|
| 9,029,866 B2 | 5/2015 | Roberts et al. | |
| 9,064,947 B2 | 6/2015 | Roberts et al. | |
| 9,153,509 B2 | 10/2015 | Klowak et al. | |
| 9,324,819 B1* | 4/2016 | Lin | H01L 23/4824 |
| 9,508,797 B2 | 11/2016 | Roberts et al. | |
| 9,589,868 B2 | 3/2017 | McKnight-MacNeil et al. | |
| 9,589,869 B2 | 3/2017 | McKnight-MacNeil et al. | |
| 9,659,854 B2 | 5/2017 | Klowak et al. | |
| 9,660,639 B2 | 5/2017 | Roberts et al. | |
| 2006/0081985 A1 | 4/2006 | Beach | |
| 2012/0086497 A1* | 4/2012 | Vorhaus | H01L 27/0207 327/427 |
| 2013/0119486 A1* | 5/2013 | Kaibara | H01L 23/4824 257/411 |
| 2015/0035080 A1* | 2/2015 | Matsumoto | H01L 27/088 257/390 |
| 2016/0322487 A1* | 11/2016 | Nogami | H01L 29/8124 |
| 2017/0077276 A1 | 3/2017 | Suzuki | |
| 2017/0154839 A1* | 6/2017 | Lin | H01L 23/485 |
| 2018/0026125 A1* | 1/2018 | Liao | H01L 29/402 257/401 |
| 2019/0267456 A1* | 8/2019 | Chen | H01L 29/404 |

* cited by examiner

SCALABLE CIRCUIT-UNDER-PAD DEVICE TOPOLOGIES FOR LATERAL GAN POWER TRANSISTORS

CROSS-REFERENCE TO RELATED APPLICATION

This application is a continuation-in-part of U.S. patent application Ser. No. 15/704,458, filed 14 Sep. 2017, entitled "HIGH CURRENT LATERAL GaN TRANSISTORS WITH SCALABLE TOPOLOGY AND GATE DRIVE PHASE EQUALIZATION", which is incorporated herein by reference in its entirety.

TECHNICAL FIELD

This invention relates to device topologies for high current lateral gallium nitride (GaN) transistors, such as GaN power switches; in particular, it relates to lateral GaN transistor structures and topologies comprising Circuit-Under-Pad (CUP).

BACKGROUND

In the context of this disclosure, Circuit-Under-Pad, or CUP, refers to semiconductor device topologies in which large area metal contact pads are provided over areas of underlying active devices or active integrated circuitry. The large area metal pads are defined by one or more on-chip conductive metallization layers and provide for die-to-package interconnections which are distributed over the active device area. The large area metal pads are vertically interconnected to the underlying regions of the active circuitry, e.g. using a plurality of micro-vias. In contrast, in traditional, non-CUP, device topologies, on-chip metal interconnect, comprising conductive tracks, laterally interconnects active device areas to busses placed between active device areas, and external contact pads to the buses are provided, typically around the periphery of the chip. However, in the latter structures, the metal interconnect buses and contact pads are provided on inactive regions of the chip, which take up significant area in between active device regions and/or around edges of the die, limiting the usable fraction of the die area that is available for the active device area.

CUP device structures are effective in increasing the usable fraction of die area available for active circuitry, and potentially provide for physical and electrical shielding of underlying circuitry, and more planar encapsulation. On the other hand, for application to power switching devices, such as high-current lateral GaN transistors, known implementations of CUP device topologies have one or more limitations, such as, limited current carrying capability. Other important considerations for high current power switching devices include reducing on-chip parasitic capacitances and inductances, e.g. source-drain capacitance and gate loop inductance. Improvements are needed to address these issues.

Improved or alternative device topologies and packaging solutions for high current, lateral GaN transistors are disclosed, for example, in the Applicant's above-referenced related co-pending U.S. patent application Ser. No. 15/704, 458, entitled "High Current Lateral GaN Transistors with Scalable Topology and Gate Drive Phase Equalization", of which this application is a continuation-in-part, and references cited therein. For example, large area, lateral GaN transistors for high voltage/high current operation, such as GaN power switches comprising GaN E-HEMTs, may comprise a plurality of transistor elements connected in parallel. In one embodiment, the device topology of a large area, large gate width GaN E-HEMT may comprise a plurality of transistor elements in the form of islands. Each island comprises individual source, drain and gate finger electrodes and a plurality of islands are interconnected to form a multi-island transistor. The "islands" may alternatively be referred to as cells or sections of a multi-cell or multi-section transistor. An overlying conductive interconnect structure is provided which comprises a source bus, a drain bus and a gate bus which interconnect respective source, drain and gate electrodes of each island.

By way of example, other device topologies and packaging solutions for lateral GaN transistors are disclosed in the following patent documents:

U.S. patent application Ser. No. 14/568,507, filed Dec. 12, 2014, now U.S. Pat. No. 9,153,509 entitled "Fault Tolerant Design for Large Area Nitride Semiconductor Devices";

U.S. patent application Ser. No. 15/091,867, filed Apr. 6, 2016, now U.S. Pat. No. 9,660,639, entitled "Distributed Driver Circuitry integrated with GaN Power Transistors";

U.S. patent application Ser. No. 15/091,867, filed Apr. 6, 2016, now U.S. Pat. No. 9,660,639, entitled "Distributed Driver Circuitry integrated with GaN Power Transistors";

U.S. patent application Ser. No. 15/027,012, filed Apr. 15, 2015, now U.S. Pat. No. 9,659,854, entitled "Embedded Packaging for Devices and Systems Comprising Lateral GaN Power Transistors";

U.S. patent application Ser. No. 15/064,750, filed Mar. 9, 2016, now U.S. Pat. No. 9,589,868, entitled "Packaging Solutions for Devices and Systems Comprising Lateral GaN Power Transistors";

U.S. patent application Ser. No. 15/064,955, filed Mar. 9, 2016, now U.S. Pat. No. 9,589,869, entitled "Packaging Solutions for Devices and Systems Comprising Lateral GaN Power Transistors";

U.S. patent application Ser. No. 14/681,676, filed Apr. 8, 2015, now U.S. Pat. No. 9,508,797, entitled "Gallium Nitride Power Devices using Island Topography";

U.S. patent application Ser. No. 1/020,712, filed Feb. 3, 2011, now U.S. Pat. No. 9,029,866, entitled "Gallium Nitride Power Devices using Island Topography";

U.S. patent application Ser. No. 13/641,003, filed Apr. 13, 2011, now U.S. Pat. No. 8,791,508 entitled "High Density Gallium Nitride Devices using Island Topology"; and U.S. patent application Ser. No. 13/388,694, filed Aug. 4, 2010, now U.S. Pat. No. 9,064,947 entitled "Island Matrixed Gallium Nitride Microwave and Power Switching Transistors".

All the above referenced patents and patent applications are incorporated herein by reference in their entirety.

There is a need for improved or alternative CUP device topologies for high current, power switching devices, which mitigate or circumvent limitations of known CUP device topologies, particularly for application to power switching systems comprising high current lateral GaN power transistors.

SUMMARY OF INVENTION

The present invention seeks to provide improved or alternative Circuit-Under-Pad (CUP) device topologies for lateral GaN power transistors, and particularly a CUP device topology which is suitable for power switching systems comprising large area, high current, lateral GaN power transistors, such as E-mode GaN HEMTs.

Aspects of the invention provide CUP device topologies for large area, high current lateral GaN power transistors, wherein the on-chip metallization provides at least one of higher current carrying capability, lower resistance, lower source and drain capacitances and inductances, and lower gate loop inductances.

One aspect of the invention provides a semiconductor device structure comprising: a lateral GaN transistor structure comprising active regions for a plurality of transistor sections of a multi-section transistor;
each transistor section comprising source, drain and gate electrodes defined on the active region;
a level of on-chip metallization defining for each section an overlying contact structure comprising a drain contact area and first and second source contact areas;
the drain contact area comprising a drain pad extending over a part of the active region located between the first and second source contact areas;
the drain pad being interconnected by conductive micro-vias to underlying parts of the drain electrodes and the first and second source contact areas being interconnected to the source electrodes.

In some embodiments, for each section, the first and second source contact areas may comprise first and second parts of a split source pad, the drain pad extending over a central part of the active region and the first and second parts of the split source pad being located each side of the drain pad, overlying the active region, and interconnected by conductive micro-vias to underlying parts of the source electrodes.

The device structure may further comprise a gate bus interconnecting gate electrodes of each section, the gate bus running in inactive regions between sections, and at least part of the first and second parts of the split source pad extending over the gate bus. In some embodiments the first and second parts of the split source pad extend over the gate bus and are contiguous with first and second parts of the source pads of neighbouring sections.

In some embodiments, the drain pad has an area which is larger than an area of the split source pad. For example, where the drain electrodes have a first cross-section and the source electrodes have a second cross-section greater than the first cross-section, the drain pad and first and second parts of the split source pad are sized in proportion to said first and second cross-sections, to optimize a maximum current density.

In some embodiments, neighbouring edges of the drain pad and the first and second parts of the split source pad are castellated.

In some embodiments, for each section, the first and second source contact areas comprise first and second source buses, the drain pad extending over a central part of the active region and the first and second source buses being located each side of the drain pad and extending over inactive regions between sections. The device structure may further comprise a gate bus interconnecting gate electrodes of each section, the gate bus running in inactive regions between each section, and the first and second source buses being routed over the gate bus.

Another aspect of the invention provides a semiconductor device comprising:
a lateral GaN transistor structure comprising active regions for a plurality of transistor sections of a multi-section transistor;
each transistor section comprising source, drain and gate electrodes defined on a respective active region;
a level of on-chip metallization defining for each section an overlying contact structure comprising a drain pad and a source pad;
the drain pad and source pad extending over the active region;
the drain pad being interconnected by conductive micro-vias to underlying drain electrodes and the source pad being is interconnected by conductive micro-vias to underlying source electrodes;
wherein the drain electrodes have a first cross-section and the source electrodes have a second cross-section greater than the first cross-section, and wherein the drain pad is larger than the source pad, areas of the drain pad and the source pad being sized in proportion to said first and second cross-sections, e.g. to optimize a maximum current density.

A further aspect of the invention provides a semiconductor device structure comprising a lateral GaN (gallium nitride) power transistor comprising:
a substrate comprising a device area of the transistor;
a nitride semiconductor layer formed on the device area of the substrate, the nitride semiconductor layer comprising a GaN heterostructure defining active regions for a plurality of transistor sections of a multi-section transistor;
a first level of on-chip metallization (M1), M1 being patterned to define source, drain and gate finger electrodes of each transistor section and a gate bus; for each section, the gate bus comprising a first portion formed on an inactive region along a first edge of the active region, and second portions of the gate bus extending from the first portion of the gate bus and formed on inactive regions between active regions of each section;
in each section, the source and drain finger electrodes being arranged as an array with the gate finger electrodes running in channel regions between adjacent source and drain finger electrodes, and the gate finger electrodes being interconnected to adjacent second portions of the gate bus; and
an overlying second level of on-chip metallization (M2), M2 being patterned to define for each section a contact structure comprising a drain pad and first and second source contact areas, in each section the drain pad extending over a central part of the active region, and the first and second source contact areas being located each side of the drain pad;
an intermetal dielectric layer provided between the first and second level metallization layers M1 and M2;
the drain pad being interconnected by conductive micro-vias through the intermetal dielectric layer to underlying drain finger electrodes; and
the first and second source contact areas being interconnected to the source finger electrodes.

In some embodiments, the first and second source contact areas may comprise first and second parts of a split source pad (which may be referred to as first and second source pads), which are contiguous with the source pads of adjacent sections, and part of the first and second source pads is routed over the underlying second portions of the gate bus for reduced gate loop inductance. Alternatively, the first and second source pads are separate from, or spaced from, the source pads of adjacent sections. In the latter arrangement, part of the first and second source pads may be routed over the underlying second portions of the gate bus for reduced gate loop inductance, or the first and second source pads may be formed over the active region without overlapping the gate bus.

In lateral GaN transistors, where the source finger electrodes are supported by field plate metallization to even out the electric field, the field plate metallization makes the cross-section of the source finger electrodes significantly larger than the cross-section of the drain fingers, e.g. by a factor of 3 or 10. Accordingly, the current density in the source finger electrodes is reduced in proportion relative to the current density in the drain finger electrodes. The areas of the first and second parts of the source pad and the area of the drain pad may be sized proportionately to account for the difference in current density. That is, the drain pad area is made larger than the source pad area.

In some embodiments, edges of the drain pad and adjacent edges of the source pads comprise castellations; e.g. castellations of the drain pad comprise drain micro-vias to the underlying drain finger electrodes and castellations of the first and second source pads comprise source micro-vias to the underlying source finger electrodes.

In one embodiment, the overlying second level of on-chip metallization (M2) is patterned to define for each section a contact structure comprising a three-piece pad structure, which may be referred to as Full-CUP, comprising one drain pad and first and second source pads for each section, in each section, the drain pad being centered over the active region and extending laterally in a width direction over a central part of the active region of the section, the first and second source pads being defined each side of the drain pad, each extending laterally over the active region of the section between the drain pad and an adjacent second portion of the gate bus, laterally spaced from the drain pad, and extending over the adjacent second portions of the gate bus;

an intermetal dielectric layer provided between the first and second level metallization layers M1 and M2;

the first and second source pads being interconnected by conductive micro-vias through the intermetal dielectric layer to underlying source finger electrodes; and the drain pad being interconnected by conductive micro-vias through the intermetal dielectric layer to underlying drain finger electrodes.

The first and second source pads may be contiguous with the source pads of adjacent sections, and part of the first and second source pads is routed over the underlying second portions of the gate bus for reduced gate loop inductance. Alternatively, the first and second source pads may be spaced from, i.e. separated from, the neighbouring source pads of adjacent sections. Sides of the drain pad and adjacent sides of the first and second source pads may optionally comprise castellations; the castellations of the drain pad comprising drain micro-vias to the underlying drain finger electrodes and castellations of the first and second source pads comprising source micro-vias to the underlying source finger electrodes.

Beneficially, the dimensions of the drain pad and the first and second source pads, and cross-sections of the source finger electrodes and drain finger electrodes are sized to equalize a current density across each active region. For example, the drain pad and the first and second source pads substantially cover the active region of each section, with a minimum required lateral spacing between the drain pad and adjacent source pads, and self-supported drain finger widths and self-supported source finger widths are selected to optimize current densities.

For example, the dimensions of the drain pad and the first and second source pads, and widths of the source finger electrodes and drain finger electrodes, and accordingly self-supported widths of the source and drain finger electrodes, are sized to optimize a maximum current density across active regions.

In some embodiments, the drain pad and the first and second source pads substantially cover the active region of each section, with a minimum required lateral spacing between the drain pad and adjacent source pads, and wherein self-supported drain finger widths and self-supported source finger widths are selected to optimize current densities.

In another embodiment, the overlying second level of on-chip metallization (M2) is patterned to define for each section a pad structure, which may be referred to as Half CUP, comprising a drain pad and a source bus, wherein the source contact areas comprise parts of the source bus;

each drain pad extending laterally in a width direction over a central part of the active region of the section;

the source bus comprising first and second portions extending over the underlying first and second portions of the gate bus for the section;

an intermetal dielectric layer provided between the first and second level metallization layers M1 and M2;

the drain pad being interconnected by conductive micro-vias through the intermetal dielectric layer to underlying drain finger electrodes, and the source finger electrodes being connected laterally to second portions of the source bus. In this embodiment, to provide an equivalent maximum current density in the source finger electrodes and drain finger electrodes, the cross-sectional area of the source finger electrodes is larger than the cross-sectional area of the drain finger electrodes.

In the Half CUP device topology, to provide an equivalent maximum current density in the source finger electrodes and drain finger electrodes, the source finger electrodes have a first cross-section and the drain finger electrodes have a second cross-section, the first cross-section being larger than the second cross-section. Beneficially, sides of the drain pad comprise castellations, castellations of the drain pad comprising drain micro-vias to underlying drain finger electrodes.

In some embodiments, the first level of metallization M1 may comprise more than one conductive metal layer; that is multiple metal layers may be used to form the gate electrodes, gate bus, source and drain finger electrodes. For example, a first metal layer defines the gate bus and source and drain finger electrodes, and a second metal layer defines the source and drain finger electrodes. The second level of metallization M2 may comprise more than one conductive metal layer.

The maximum current density in the source finger electrodes and drain finger electrodes is reduced by reducing the self-supported width of the source and drain finger electrodes. Routing the source bus over the underlying gate bus, or running at least part of the first and second source pads over the underlying gate bus, provides flux cancellation and helps to reduce gate loop inductance. Source strips/pads are laterally spaced from drain strip/pads, and are sized to provide external contact pad areas, without need for another level of metal to interconnect multiple source strips or drain strips. Elimination of an additional level of metal, which would be required for a multi-strip CUP with mesh interconnect structure, reduces source-drain capacitances.

Thus, the disclosed CUP device topologies provide for at least one of improved current carrying capability, reduced resistance, reduced source-drain capacitances, and reduced gate loop inductance, relative to known CUP device topologies.

The disclosed CUP device topologies also provide for scalability of the device, i.e. integration of a large number of transistor sections connected in parallel to enable fabrication of very large area, high current lateral GaN transistors with improved gate drive phase equalization and improved current balance across the area of the multi-section transistor.

Thus, CUP device topologies are provided for lateral GaN power transistors, with particular application for large area, high current lateral GaN HEMTS, that mitigate or circumvent one or more limitations of known CUP device topologies.

BRIEF DESCRIPTION OF THE DRAWINGS

In the drawings, identical or corresponding elements in the different Figures have the same reference numeral, or corresponding elements have reference numerals incremented by 100 in successive Figures.

DETAILED DESCRIPTION OF EMBODIMENTS

Figure 1:
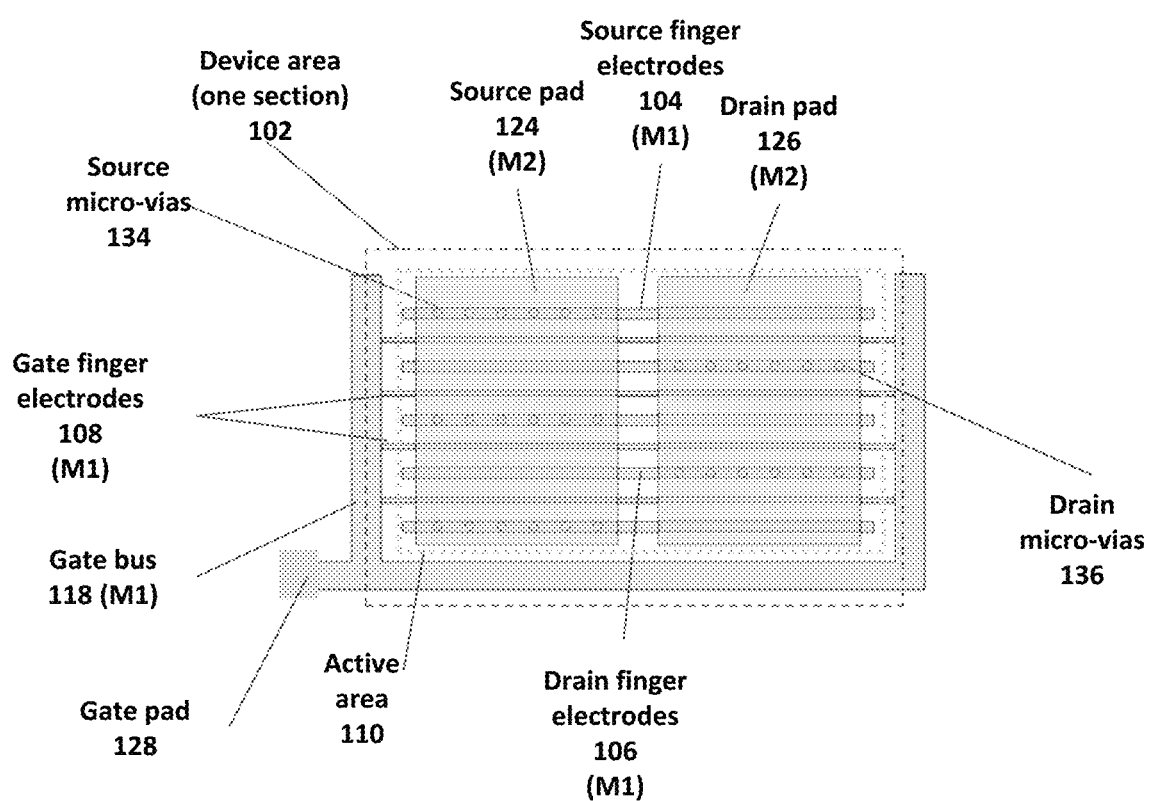
FIG. 1 (Prior art) shows an example of a known CUP device topology for one section or cell of a multi-section power transistor, comprising a two-piece pad structure comprising a source pad and a drain pad.

FIG. 1 (Prior art) shows an example of a conventional CUP device topology 100-1 for the device area of one cell or section 102 of a multi-section lateral power transistor, comprising an active area 110 and an arrangement of source finger electrodes 104, drain finger electrodes 106 and gate finger electrodes 108, defined by a first level of metal, M1. Source finger electrodes 104 and gate finger electrodes 108 extend over the active area 110. Gate electrodes 108 run between adjacent source finger electrodes 104 and drain finger electrodes 106 and interconnect to a gate bus 118 which runs over inactive regions of the device area. A second level of metal M2 defines a two-piece pad structure, comprising a source pad 124 and a drain pad 126 which extend over the active area 110 of the transistor section 102, spaced from the gate bus 118. The first and second levels of on-chip conductive metallization, M1 and M2, are separated by a layer of intermetal dielectric. The source pad 124 is connected to underlying source finger electrodes 104 by conductive micro-vias 134. The drain pad 126 is connected to underlying drain finger electrodes 106 by conductive micro-vias 136. A large area lateral power transistor may comprise an array of a plurality of transistor sections, e.g. a row of n sections 102. The source pads 124 and drain pads 126 of each section provide for external source and drain contacts to each section. The gate bus 118 extends to at least one gate pad 128 for an external gate contact.

Figure 2:
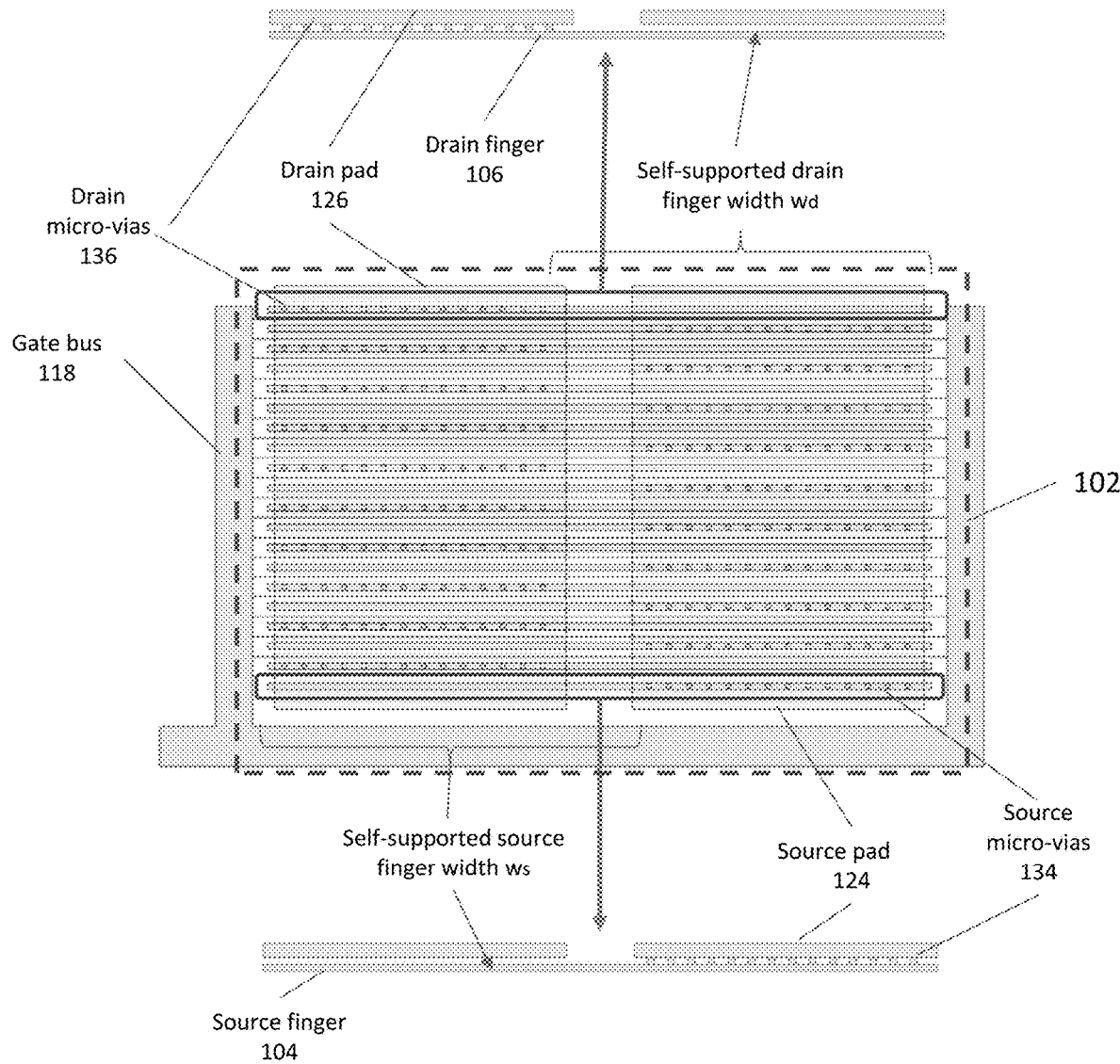
FIG. 2 (Prior art) shows more details of the CUP device topology illustrated in FIG. 2, comprising a plan view of layers of one section of a multi-section power transistor and cross-sectional side views to illustrate source and drain finger support.

FIG. 2 (Prior art) shows an enlarged view of a one section of lateral power transistor comprising a known CUP device topology 100-2, similar to that illustrated in FIG. 1. The plan view in the center of the drawing shows a plan view similar to FIG. 1, for a section 102 of larger area, with a plurality of source finger electrodes 104 and drain finger electrodes 106. The upper cross-sectional view is taken through one of the drain fingers 106 and the overlying drain pad 126, showing drain micro-via connections 136. The lower cross-sectional view is taken through one of the source fingers 104 and the overlying source pad 124, showing source micro-via connections 134. As illustrated, micro-via connections 134 and 136 are made to less than half of the width of each source finger electrode 104 and drain finger electrode 106. That is, more than half the width W of each source finger ($w_s$) and each drain finger ($w_d$) is "self-supported", which means that current must travel laterally more than half the width of each finger, between the end of each finger and the micro-vias. In the other parts of width of the source and drain fingers the plurality of micro-vias collect/distribute current, resulting in a lower current density in that part of the width of each finger (i.e. the part comprising micro-vias). The current carrying capability of this device structure is limited by the lateral bussing of the current in the source and drain fingers in the self-supported width of each of the source and drain fingers. Another disadvantage of this topology is that there is high gate loop inductance due to lack of gate bus to source bus overlap.

Figure 3:
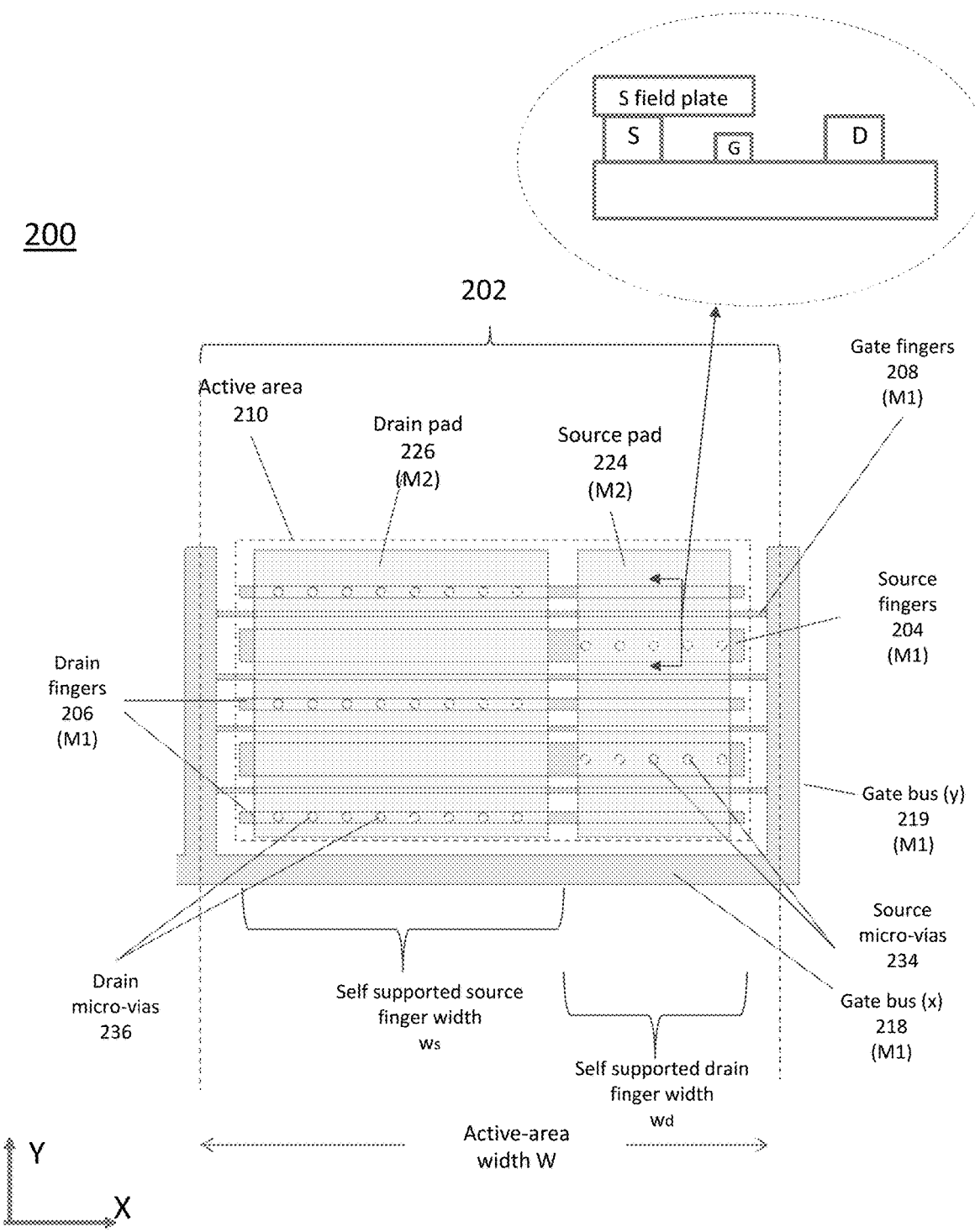
FIG. 3 shows a plan view of CUP device topology for one section or cell of a multi-section lateral GaN power transistor, comprising a two-piece pad structure comprising a source pad and a drain pad, of an embodiment wherein the source pad and drain pad have different sizes.

FIG. 3 shows a schematic diagram of a top plan view of part of a GaN-on-silicon device structure 200, comprising one section 202 of a lateral GaN power transistor arranged as a multi-section transistor comprising a two-piece pad structure wherein source pad 224 and the drain pad 226 have different sizes. In lateral GaN power transistors, the source finger electrodes 204 are supported by field plate metallization to even out the electric field around the source and gate finger electrodes, as shown schematically in the inset in FIG. 3, which shows a simplified schematic cross-section through source, gate and drain finger electrodes, S, G, D respectively on the underlying active region (overlying source and drain pad metal layers are omitted). The source field plate metallization makes the effective cross-section of the source finger electrodes 204 significantly larger than the cross-section of the drain fingers 206, e.g. by a factor of 2, 3 or more, perhaps a factor of 5 to 10. Accordingly, the current density in the source finger electrodes is reduced in proportion, i.e. relative to the current density in the drain finger electrodes. The areas of the first and second parts of the source pad 224 and the drain pad 226 are sized proportionately to account for the difference in current densities in the source finger electrodes and drain finger electrodes. That is, the drain pad area is made larger than the source pad area to provide equivalent current densities. Drain micro-vias 236 are provided to interconnect the drain pad 226 to the underlying drain finger electrodes 206. Source micro-vias 234 are provided to interconnect the source pad 224 to the underlying source finger electrodes 204. As illustrated in FIG. 3, the self-supported finger width $w_d$ of the drain finger electrodes, which have a smaller cross-section and carry a higher current density, is therefore reduced relative to that of the prior art structures shown in FIGS. 1 and 2. However, in this 2-piece pad structure, the drain pad is located close to the gate bus, and in general it is desirable to separate high and low voltage elements on the die, i.e. specifically to separate the gate and drain. The proximity of the drain pad to the gate pad adds gate-drain capacitance. This capacitance should be avoided since it is amplified by the voltage gain due to the Miller effect. Also, in this structure, where there is a large difference in the cross-section of the source finger electrodes and drain finger electrodes, e.g. if source fingers have a cross-section of 10 times the drain fingers, if the source pad and drain pad are proportionately sized, the source pad may be too narrow to provide a required contact area for a source contact pad.

Figure 4:
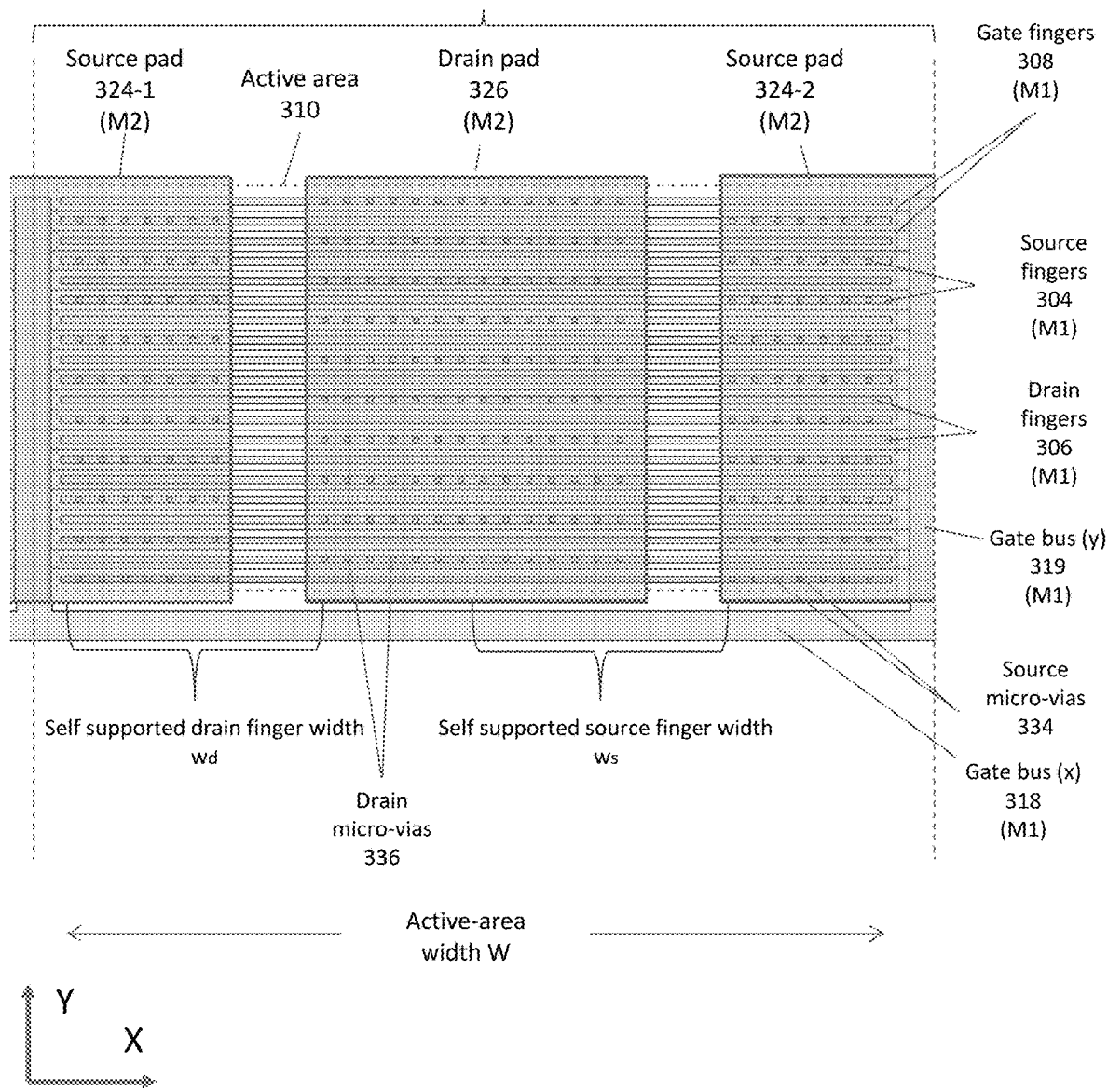
FIG. 4 shows a plan view of a GaN-on-silicon device structure comprising one section of a multi-section lateral GaN transistor according to a first embodiment

FIG. 4. shows a schematic diagram of a top plan view of part of a GaN die in the form of a GaN-on-silicon device structure 300 comprising one section 302 of a lateral GaN transistor arranged as a multi-section transistor according to a first embodiment. For example, the lateral GaN transistor structure comprises a GaN epitaxial layer stack formed on a silicon substrate, and the epitaxial layer stack comprises GaN/AlGaN heterostructure layers which define an active area, i.e. a 2 DEG active region 310 for each transistor section 302. A first metallization layer M1 is patterned to form an array of source finger electrodes 304 and drain finger electrodes 306 on each active region 310 of the substrate. The first metallization layer also defines gate finger electrodes 308 running between source fingers 304 and drain fingers 306, and a gate bus having a first portion 318 running in an x direction over an inactive region along one edge of the active area, and second portions 319 running in a y direction over inactive regions which run between active areas of each section of the transistor. The gate finger electrodes 308 are connected at each end to adjacent second portions of gate bus 319. For example, the first level of metallization M1 may comprise a conductive layer of a first metal defining the gate electrodes and gate bus, and conductive layer of a second metal defining the source and drain finger electrodes; the second metal also defines source field plates for the source fingers.

A second level of metallization M2 is patterned to provide a three-piece pad structure comprising a single piece, large area drain pad 326 extending over a central part of the active area 310 of each section, with a plurality of drain micro-via connections 336 to underlying drain finger electrodes 306, and a two-piece, split source pad 324, comprising a pair of first and second source pad parts 324-1 and 324-2 on each side of the drain pad, with source micro-via connections 334 to the underlying source finger electrodes 304. The first and second source parts 324-1 of the split source pad 324 are placed each side of the drain pad, spaced from the drain strip pad 326, and the first and second source pads 324 also extend laterally and overlap the underlying second portions of the gate bus 319. The first and second source pads 324-1 and 324-2 are contiguous with source pads of neighbouring sections, as shown in more detail in the multi-section view shown in FIG. 5. The drain micro-vias 336 are provided across the width of the drain pad to connect the drain pad 326 to underlying drain fingers 306. The source micro-vias 334 are provided across the width of the source pads 234-1 and 234-2 to connect to underlying source fingers 304. By centering the drain pad 326 over the active area, the self-supported lateral current carrying width $w_d$ of each drain finger is reduced, and the self-supported lateral current carrying width $w_s$ of each source finger is reduced, compared with the two-piece pad CUP topology shown in FIG. 2. Lateral widths of the two source pads 324-1 and 324-2 and one drain pad 326 of three-piece pad structure shown in FIG. 4 can be configured to reduce the source and drain finger current density by about 50% compared to a conventional two-piece pad CUP structure, such as shown in FIGS. 1 and 2. Also, when the source pads run over the gate buses, as illustrated in FIG. 4, this layout also provides effective gate loop flux cancellation, which reduces gate loop inductance, as described in more detail in the above referenced U.S. patent application Ser. No. 15/704,458. To simplify FIG. 4, the source fingers 304 and drain fingers 306 are drawn with the same dimensions; in practice, as described with reference to FIG. 3, the source fingers 304 of a lateral GaN power transistor typically comprise source field plates, so that source fingers 304 have a larger cross-section than the cross-section of the drain fingers 306. The lateral widths of the two source pads 324-1 and 324-2 and one drain pad 326 of three-piece pad structure shown in FIG. 4 are therefore sized in proportion to the relative cross-sections of the source fingers 304 and the drain fingers 306, as described with reference to the structure shown in FIG. 3.

Figure 5:
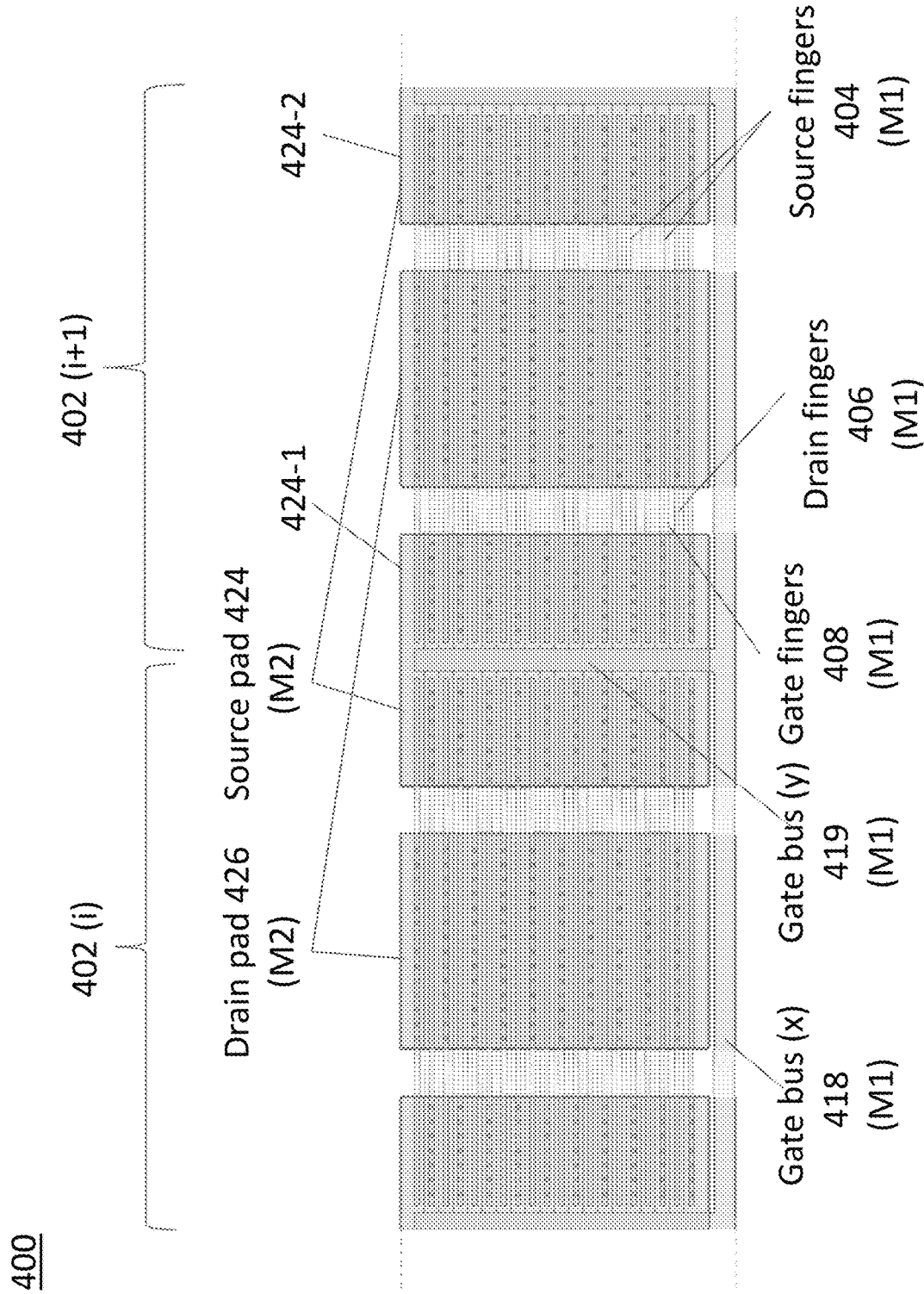
FIG. 5 shows a plan view of two cells or sections (i, i+1) of a multi-section lateral GaN power transistor based on the topology shown in FIG. 4.

FIG. 5 shows a plan view of two cells or sections, 402, i.e. cell i and i+1, of a multi-section lateral GaN transistor arrangement based on the topology shown in FIG. 4, to illustrate that this topology is scalable for a multi-cell, large area transistor, arranged as a linear array of n transistor cells or sections. Corresponding parts in FIG. 5 are numbered with the same reference numerals as used in FIG. 4, incremented by 100. Thus FIG. 5 shows drain pads 426 centred on the active area of each section, with gate buses 418 and 419 extending in x and y directions over inactive regions between active areas of each section. Source micro-vias connect the pair of source pads 424-1 and 424-2 to underlying source finger electrodes 404, and drain micro-vias connect the drain pads 426 to underlying drain finger electrodes 406. This diagram also illustrates how each split source pad 424, comprising first and second parts 424-1 and 424-2, and extends laterally over adjacent cell active areas, contiguous with source pads of adjacent cells and extending over the underlying gate bus, so that the routing of the source pad current and the gate bus current provides for gate bus to source pad inductive coupling (i.e. flux cancellation) to reduce gate loop inductance.

The sections of the multi-section transistor are arranged as an array to optimize the active area of the die and optimize the current carrying capability of the lateral GaN transistor. Parameters of each section are selected to optimize a maximum current density over the active area of each section. For example, these parameters include the active area of each section, the widths of the source and drain finger electrodes, the dimensions of the source and drain pads, the arrangement of the source and drain micro-vias, and the self-supported lateral current carrying width of the source and drain finger electrodes. Gate pads for the gate bus are provided as needed, e.g. gate pads at each side of an array of transistor sections. For a large area GaN transistor, a repeating pattern of sections can also be arranged to form a two-dimensional array of transistor sections in which neighbouring sections share a gate bus (e.g. see FIG. 18 of U.S. Ser. No. 15/704,458).

In the embodiments shown in FIGS. 4 and 5, the contact structure comprises source pads 424 and drain pads 426 which are large areas of metal which provide for contact areas for external source and drain contacts, e.g. for embedded packaging or wirebonded packaging. They are therefore referred to herein as source and drain pads, but may alternatively be referred to as source and drain strips which provide external contact areas. In some prior structures, source and drain strips refer to metal structures running over finger electrodes, which connect to underlying fingers by micro-vias, but include structures which are usually passivated and not exposed, and the term pad typically refers to exposed top metal structures on the die through which the die interfaces to external connection. The source strips/pads 424 and drain strips/pads 426 described herein provide both functions, i.e. are connected by micro-vias to respective underlying source or drain fingers and are also large enough to provide contact areas for external contacts.

Figure 6A:
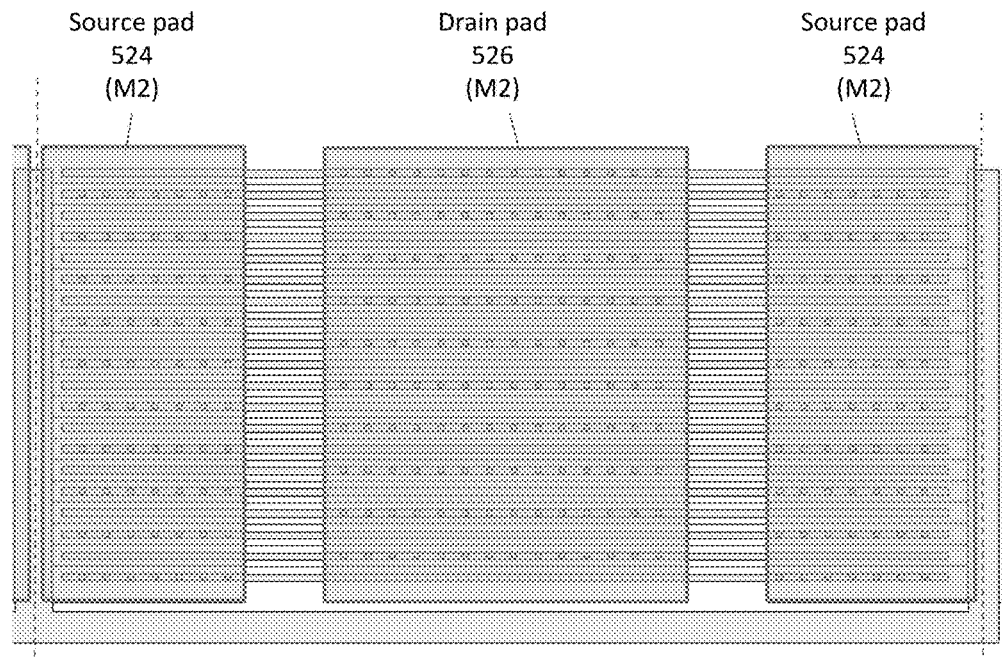
FIG. 6A shows a plan view of a GaN-on-silicon device structure comprising one section of a multi-section lateral GaN power transistor according to a second embodiment.
Figure 6B:
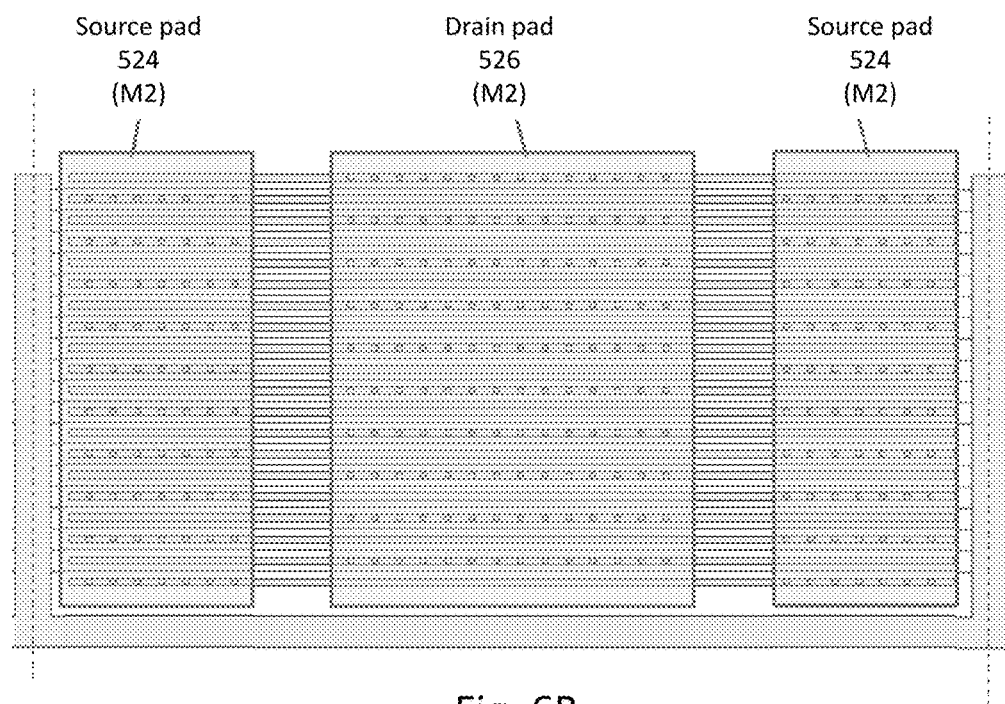
FIG. 6B shows a plan view of a GaN-on-silicon device structure comprising one section of a multi-section lateral GaN power transistor according to a third embodiment.

FIG. 6A shows a schematic diagram of a top plan view of a GaN-on-silicon device structure 500A comprising one section of a multi-section lateral GaN transistor according to second embodiment to illustrate patterning of first and second metallization layers M1 and M2. Many elements of this device structure are similar to those shown in FIG. 5 and are numbered with the same reference numerals incremented by 100. This variant of the three-piece pad device topology differs from that shown in FIG. 4 in that the first and second source pads 524 are separated from the source pads of adjacent sections, and only partly overlap the adjacent underlying second portion of the gate buses 519. In another variant of the device structure 500B, as shown in FIG. 6B, the source pads 524 may be defined only over the active area, without overlapping the adjacent second portions of the gate buses 519. Source pads 524 are spaced from source pads of neighbouring sections. In contrast, as illustrated in FIG. 4, the source pads 424 are contiguous with source pads of adjacent sections to fully overlap the underlying second portions of the gate buses 419, for reduced gate loop inductance. The three-piece pad structures of the embodiments shown in FIGS. 6A and 6B both provide for reduced self-supported finger widths of the source and drain finger electrodes, and reduced current densities, compared to a conventional two-piece pad structure of FIGS. 1 and 2.

Figure 7:
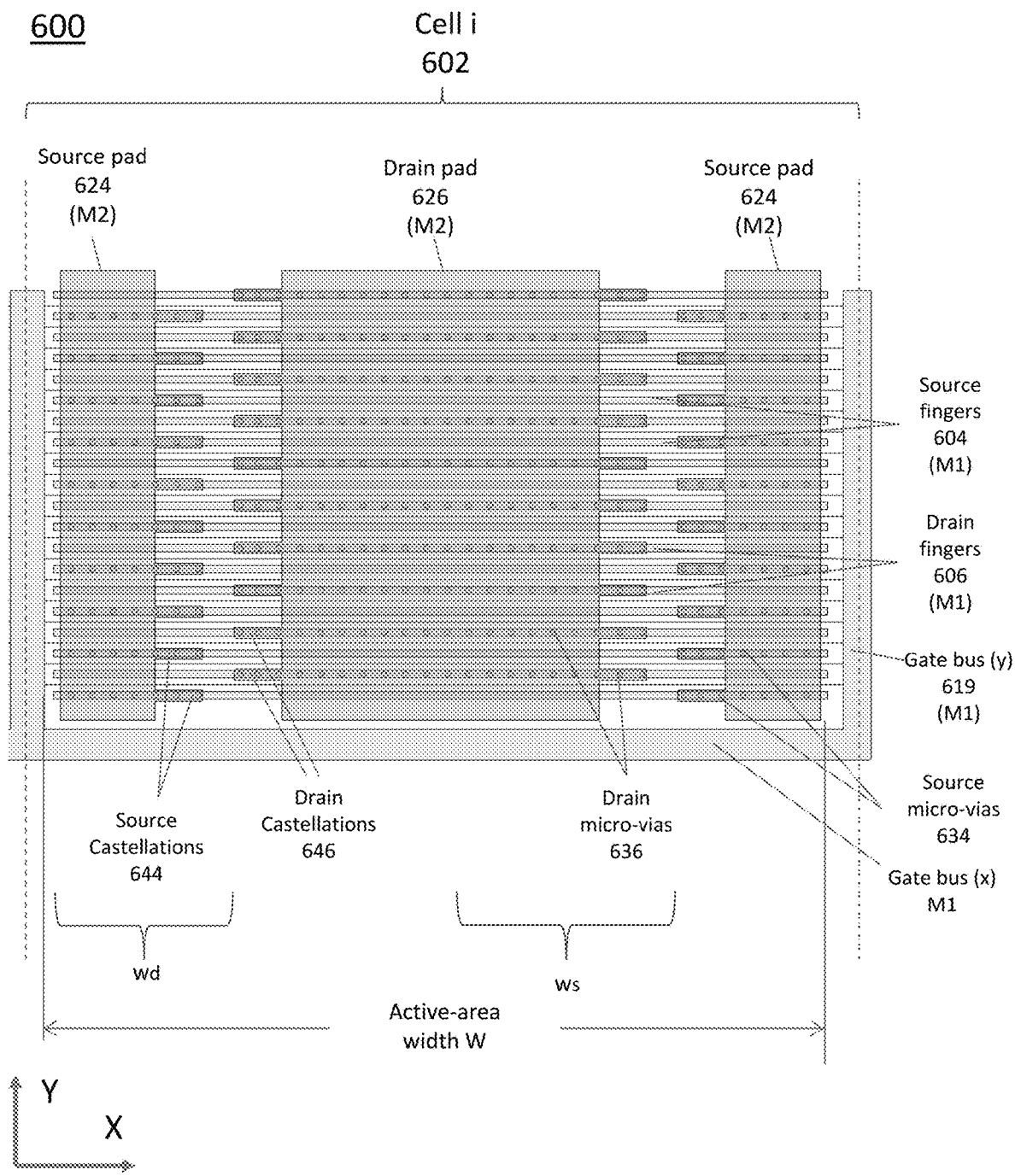
FIG. 7 shows a plan view of a GaN-on-silicon device structure comprising one section of a multi-section lateral GaN power transistor according to a fourth embodiment.

FIG. 7 shows a schematic diagram of a top plan view of a GaN-on-silicon device structure 600 comprising one cell or section 602 of a multi-section lateral GaN transistor of a fourth embodiment, to illustrate patterning of a first and second conductive metallization layers M1 and M2. The first level of metallization M1 is patterned to define source, drain and gate fingers on active areas of each section, and gate buses as for the device structures of the embodiments described above. In the device structure 600 of this embodiment, each section comprises a three-piece pad structure, similar to those shown in FIGS. 5, 6A and 6B. However adjacent edges of the source pads 624 and drain pads 626 comprise "castellations" 644 and 646 respectively. For example, as illustrated schematically, the edges of the source and drain pads are notched or crenellated to form rectangular castellations. The source castellations 644 extend from the main part of the source pad 624 and source micro-vias 634 are provided to connect the source castellations to the underlying source finger electrodes 604. The drain castellations 646 extend from the main part of the drain pad 626 and drain micro-vias 636 are provided on the drain castellations 646 to the underlying drain finger electrodes 606. Edges of the source pads 624 and drain pad 626 are patterned, or cut away to form notches between the castellations. For example, comparing the three-piece pad structure of FIG. 7 with that shown in FIG. 6B, if the dimensions of the source pads and the drain pads are configured so that the self-supported widths of the source finger electrodes are the same, the structure shown in FIG. 7 allows for a reduced self-supported width for the drain finger electrodes compared that shown in with FIG. 6B. Also, the castellations provide regions of lower current density at the neighbouring edges of the source pads and drain pad, and higher current density in the main part of the source pads and drain pads. Current running along edges of the pads belong to opposite signals, i.e. source and drain currents, and have an inductive coupling effect on each other. The castellations provide for reduced source drain capacitance and reduced inductive coupling between adjacent regions of the source and drain pads. In variants of the structure 600 shown in FIG. 7, the source pads 624 may partly or fully overlap the underlying second portions 619 of the gate bus, as illustrated for the embodiments shown in FIGS. 6A and 6B.

Figure 8:
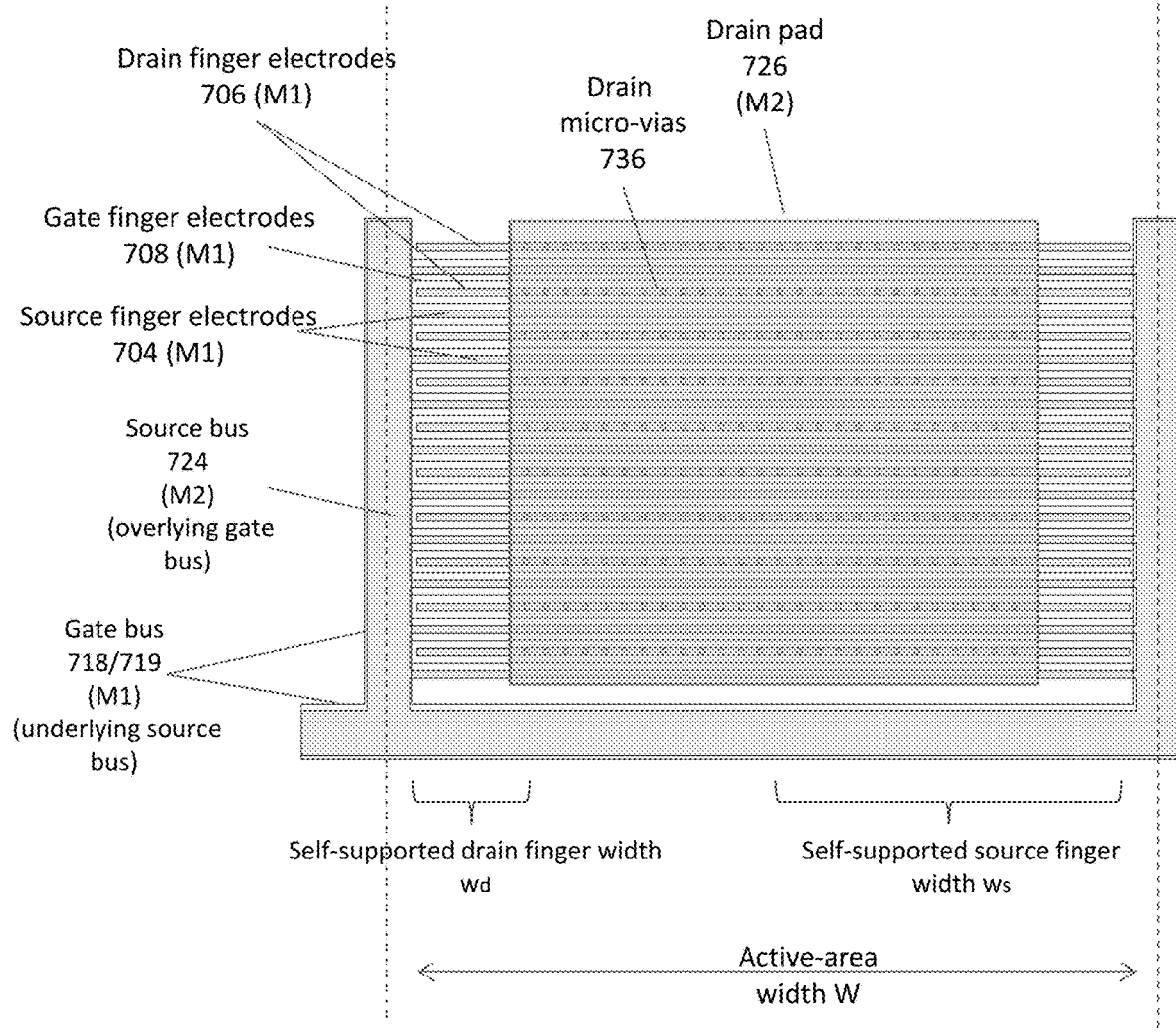
FIG. 8 shows a plan view of a GaN-on-silicon device structure comprising one section of a multi-section lateral GaN power transistor according to a fifth embodiment; and The foregoing and other objects, features, aspects and advantages of the present invention will become more apparent from the following detailed description, taken in conjunction with the accompanying drawings, of preferred embodiments of the invention, which description is by way of example only.

FIG. 8 shows a schematic diagram of a top plan view of a GaN-on-silicon device structure 700 comprising one cell or section of multi-section lateral GaN transistor of a fifth embodiment, to illustrate patterning of a first and second conductive metallization layers M1 and M2. The first level of metallization M1 is patterned to define source, drain and gate fingers 704, 706, 708 respectively, on active areas of each section, and gate buses 718/719 as for the device structures of the embodiments described above. The second metallization layer M2 is patterned to define a large area drain pad, centred over the section and covering a large part of the active area of the section. The second level of metal M2 also defines a source bus 724 having first and second portions that are routed over first and second portions of underlying the gate bus 718/719. This pad structure is referred to as a "Half CUP" topology, because the drain pad overlies the active area, but the source pad is narrowed to the extent that it takes the form of a source bus overlying the gate bus, and the source bus is routed entirely over the gate bus, or at least does not extend substantially over the active area. As noted above, the first and second levels of metal M1, M2 may each comprise more than one metal layer, for example a first metal layer defines the gate buses and source and drain finger electrodes and a second metal layer defines source and drain finger electrodes. In this device topology, a majority of the width of each drain finger is supported by the wide, large area, drain pad 726. For example, only about 15% of the drain finger width is self-supported. The full length of each source finger is self-supported, so if the source finger electrodes are connected to the adjacent second portions of the source bus at each end, the self-supported finger width is 50% of the width W of the active area of the section. The source and gate buses run over inactive areas between each section of the transistor. All source and source sense current is channelized through the source busses, which allows for effective gate loop flux cancellation to equalize gate loop inductance for each cell. In this layout, the large area drain pad is separated by an appropriate distance from the source bus, but can be large enough to extend over most of the active area, to provide a significant reduction of drain finger current density. This layout is applicable when the source finger cross-sectional area is made much larger than that of the drain finger cross-sectional area, to reduce the source finger current density, so that, for example, if the cross-section of the source finger electrodes is, e.g., 10 times that of the drain finger electrodes, in comparison with the 3-piece pad structure shown in FIG. 5, the width of the drain pad is increased, and the width of the source pads is decreased proportionately, so that the source pads take the form of narrower source buses which entirely overlie the gate buses (without extending over the active area) and the drain pad covers a larger part of the active area, as illustrated schematically in FIG. 8. Optionally edges of the drain pad may be castellated as described for the device structure illustrated in FIG. 7. The cut away parts (notches) between castellations of the drain pad push the main stream of the drain current further away from the main stream of the source current in the adjacent portions of the source bus, thus reducing positive coupling between them, to provide less drain-to-source inductance. At the same time the extended parts of castellated edge support the drain finger electrodes, with no reduction of self-supported finger electrode width.

While device structures of several embodiments have been described in detail, to illustrate examples of CUP device topologies comprising a pad structure wherein the drain pad is centred on the active area and the source pad is split into parts placed each side of the drain pad, e.g. a three-piece pad structure, or wherein the pad structure takes the form of a contact structure comprising a drain pad and a source bus (referred to as "Half CUP"), these embodiments are described by way of example only. As mentioned above, some features of each embodiment may be combined in different combinations to provide variants of these embodiments, e.g. in which source and/or drain pads are castellated, and in which source pads are separate from or contiguous with source pads of neighbouring sections of the transistor. While these embodiments have been described with references to first and second levels of conductive metallization M1 and M2, each metallization level may comprise one or more conductive layers, e.g. M1 may comprise a first metal layer defining the gate electrodes and gate bus, and a second metal layer defining the source and drain finger electrodes, and then M2 comprises another metal layer or layers defining the drain pads and source pads or source buses.

CUP interconnect structures provide for high current GaN power switching devices with high density active areas. High density active area provides for high gate width and low on resistance. Appropriate design and layout of CUP interconnect structures can potentially reduce interconnect resistance of metal bus interconnects. While high density active area will not improve input or output FOM, a poor layout can potentially have an adverse effect on FOM. CUP interconnect structures allow for larger area pads for the GaN power switching devices, which facilitates packaging, e.g. using low inductance embedded packaging or conventional wire bonded packaging.

The CUP topologies disclosed herein result in higher current carrying capacity than prior CUP topologies. Also use of micro-strip, strip-line and coplanar waveguide techniques for flux cancellation, i.e. by routing at least part of the source pads or source buses over underlying gate buses, reduces gate loop inductance. The proposed topologies increase the useable die fraction for active area since the interconnect bussing is above the active area. These structures with larger area pads also enable more planar encapsulation, and potential physical and electrical shielding of underlying active circuitry and related passivating layers.

Although embodiments of the invention have been described and illustrated in detail, it is to be clearly understood that the same is by way of illustration and example only and not to be taken by way of limitation, the scope of the present invention being limited only by the appended claims.

The invention claimed is:
1. A semiconductor device structure comprising:
   a lateral GaN transistor structure comprising active regions for a plurality of transistor sections of a multi-section transistor;
   each transistor section comprising source, drain and gate electrodes defined on the active region;
   a level of on-chip metallization defining for each section a contact structure comprising a drain contact area and first and second source contact areas;
   the drain contact area comprising a drain pad extending over a part of the active region located between the first and second source contact areas;
   the drain pad being interconnected by conductive micro-vias to underlying parts of the drain electrodes and
   the first and second source contact areas being interconnected to the source electrodes,
   the first and second source contact areas comprising first and second parts of a split source pad, the drain pad extending over a central part of the active region of the section, and the first and second parts of the split source pad being located each side of the drain pad, overlying the active region, and interconnected by conductive micro-vias to underlying parts of the source electrodes, and
   a gate bus interconnecting gate electrodes of each section, the gate bus running in inactive regions between sections, and at least part of the first and second parts of the split source pad extending over the gate bus.

2. The semiconductor device structure of claim 1, wherein the drain pad has an area which is larger than an area of the split source pad.

3. The semiconductor device structure of claim 2, wherein the drain electrodes have a first cross-section and the source electrodes have a second cross-section greater than the first cross-section, and wherein said areas of the drain pad and first and second parts of the split source pad are sized in proportion to said first and second cross-sections.

4. The semiconductor device structure of claim 3, wherein neighbouring edges of the drain pad and the first and second parts of the split source pad are castellated.

5. A semiconductor device structure comprising:
   a lateral GaN transistor structure comprising active regions for a plurality of transistor sections of a multi-section transistor;
   each transistor section comprising source, drain and gate electrodes defined on the active region;
   a level of on-chip metallization defining for each section a contact structure comprising a drain contact area and first and second source contact areas;
   the drain contact area comprising a drain pad extending over a part of the active region located between the first and second source contact areas;
   the drain pad being interconnected by conductive micro-vias to underlying parts of the drain electrodes and
   the first and second source contact areas being interconnected to the source electrodes,
   the first and second source contact areas comprising first and second parts of a split source pad, the drain pad extending over a central part of the active region of the section, and the first and second parts of the split source pad being located each side of the drain pad, overlying the active region, and interconnected by conductive micro-vias to underlying parts of the source electrodes, and
   a gate bus interconnecting gate electrodes of each section, the gate bus running in inactive regions between sections, and wherein the first and second parts of the split source pad extend over the gate bus and are contiguous with first and second parts of the split source pads of neighbouring sections.

6. The semiconductor device structure of claim 5, wherein the drain pad has an area which is larger than an area of the split source pad.

7. The semiconductor device structure of claim 6, wherein the drain electrodes have a first cross-section and the source electrodes have a second cross-section greater than the first cross-section, and wherein said areas of the drain pad and first and second parts of the split source pad are sized in proportion to said first and second cross-sections.

8. The semiconductor device structure of claim 7, wherein neighbouring edges of the drain pad and the first and second parts of the split source pad are castellated.

9. A semiconductor device structure comprising a lateral GaN (gallium nitride) power transistor comprising:
   a substrate comprising a device area of the transistor;
   a nitride semiconductor layer formed on the device area of the substrate, the nitride semiconductor layer comprising a GaN heterostructure defining active regions for a plurality of transistor sections of a multi-section transistor;
   a first level of on-chip metallization (M1), M1 being patterned to define source, drain and gate finger electrodes of each transistor section and a gate bus; for each section, the gate bus comprising a first portion formed on an inactive region along a first edge of the active region, and second portions of the gate bus extending from the first portion of the gate bus and formed on inactive regions between active regions of each section;
   in each section, the source and drain finger electrodes being arranged as an array with the gate finger electrodes running in channel regions between adjacent source and drain finger electrodes, and the gate finger electrodes being interconnected to adjacent second portions of the gate bus;
   an overlying second level of on-chip metallization (M2), M2 being patterned to define for each section a contact structure comprising a drain pad and first and second source contact areas, in each section the drain pad extending over a central part of the active region, and the first and second source contact areas being located each side of the drain pad;
   an intermetal dielectric layer provided between the first and second level metallization M1 and M2;
   the drain pad being interconnected by conductive micro-vias through the intermetal dielectric layer to underlying drain finger electrodes; and
   the first and second source contact areas being interconnected to the source finger electrodes.

10. The semiconductor device structure of claim 9, wherein the first and second source contact areas comprise first and second parts of a split source pad (first and second source pads), which are contiguous with the source pads of adjacent sections, and part of the first and second source pads is routed over said second portions of the gate bus for reduced gate loop inductance.

11. The semiconductor device structure of claim 9, wherein the first and second source contact areas comprise first and second parts of a split source pad (first and second source pads), wherein the first and second source pads are spaced from neighbouring source pads of adjacent sections.

12. The semiconductor device structure of claim 11, wherein part of the first and second source pads is routed over said second portions of the gate bus for reduced gate loop inductance.

13. The semiconductor device structure of claim 11, wherein the first and second source pads are formed over the active region without overlapping the gate bus.

14. The semiconductor device structure of claim 9, wherein the contact structure comprises a three-piece pad structure comprising one drain pad and first and second source pads for each section,
   in each section, the drain pad being centered over the active region and extending laterally in a width direction over a central part of the active region of the section,
   the first and second source pads being defined each side of the drain pad, each extending laterally over the active region of the section between the drain pad and an adjacent second portion of the gate bus, laterally spaced from the drain pad, and extending over the adjacent second portions of the gate bus;
   the first and second source pads being interconnected by conductive micro-vias through the intermetal dielectric layer to underlying source finger electrodes; and
   the drain pad being interconnected by conductive micro-vias through the intermetal dielectric layer to underlying drain finger electrodes.

15. The semiconductor device structure of claim 14, wherein the first and second source pads are contiguous with the source pads of adjacent sections, and part of the first and second source pads is routed over said second portions of the gate bus for reduced gate loop inductance.

16. The semiconductor device structure of claim 14, wherein the first and second source pads are spaced from neighbouring source pads of adjacent sections.

17. The semiconductor device structure of claim 16, wherein a part of each of the first and second source pads is routed over an underlying second portion of the gate bus for reduced gate loop inductance.

18. The semiconductor device structure of claim 14, wherein dimensions of the drain pad and the first and second source pads, and cross-sections of the source finger electrodes and drain finger electrodes are sized to equalize a current density across each active region.

19. The semiconductor device structure of claim 14, wherein the drain pad and the first and second source pads substantially cover the active region of each section, with a minimum required lateral spacing between the drain pad and adjacent source pads, and wherein self-supported drain finger widths and self-supported source finger widths are selected to optimize current densities.

20. The semiconductor device structure of claim 14, wherein sides of the drain pad and adjacent sides of the first and second source pads comprise castellations, castellations of the drain pad comprising drain micro-vias to underlying drain finger electrodes and castellations of the first and second source pads comprising source micro-vias to underlying source finger electrodes.

21. The semiconductor device structure of claim 9, wherein the source contact areas comprise parts of a source bus;
   each drain pad extending laterally in a width direction over a central part of the active region of the section;
   the source bus comprising first and second portions extending over the underlying first and second portions of the gate bus for the section;
   the drain pad being interconnected by conductive micro-vias through the intermetal dielectric layer to underlying drain finger electrodes, and
   the source finger electrodes being connected laterally to second portions of the source bus.

22. The semiconductor device structure of claim 21 wherein, to provide an equivalent maximum current density in the source finger electrodes and drain finger electrodes, the source finger electrodes have a first cross-section and the drain finger electrodes have a second cross-section, the first cross-section being larger than the second cross-section.

23. The semiconductor device structure of claim 21, wherein sides of the drain pad comprise castellations, castellations of the drain pad comprising drain micro-vias to underlying drain finger electrodes.

24. A semiconductor device structure comprising:
- a lateral GaN transistor structure comprising active regions for a plurality of transistor sections of a multi-section transistor;
- each transistor section comprising source, drain and gate electrodes defined on the active region;
- a level of on-chip metallization defining for each section a contact structure comprising a drain contact area and first and second source contact areas;
- the drain contact area comprising a drain pad extending over a part of the active region located between the first and second source contact areas;
- the drain pad being interconnected by conductive micro-vias to underlying parts of the drain electrodes and
- the first and second source contact areas being interconnected to the source electrodes,
- the first and second source contact areas comprising first and second parts of a split source pad, the drain pad extending over a central part of the active region of the section, and the first and second parts of the split source pad being located each side of the drain pad, overlying the active region, and interconnected by conductive micro-vias to underlying parts of the source electrodes,
- wherein the drain pad has an area which is larger than an area of the split source pad, and
- wherein the drain electrodes have a first cross-section and the source electrodes have a second cross-section greater than the first cross-section, and wherein said areas of the drain pad and first and second parts of the split source pad are sized in proportion to said first and second cross-sections.

* * * * *